US010867774B2

(12) United States Patent
Iizuka

(10) Patent No.: US 10,867,774 B2
(45) Date of Patent: Dec. 15, 2020

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventor: Osamu Iizuka, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/042,380

(22) Filed: Jul. 23, 2018

(65) Prior Publication Data
US 2019/0035603 A1 Jan. 31, 2019

(30) Foreign Application Priority Data

Jul. 28, 2017 (JP) ................. 2017-146751

(51) Int. Cl.
*H01J 37/317* (2006.01)
*H01J 37/20* (2006.01)
(Continued)

(52) U.S. Cl.
CPC ........ *H01J 37/3177* (2013.01); *H01J 37/045* (2013.01); *H01J 37/20* (2013.01);
(Continued)

(58) Field of Classification Search
None
See application file for complete search history.

(56) References Cited

U.S. PATENT DOCUMENTS

| 5,834,783 A * | 11/1998 | Muraki | B82Y 10/00 250/398 |
| 2003/0085365 A1* | 5/2003 | Yahiro | H01J 37/28 250/492.2 |
| 2011/0253892 A1* | 10/2011 | Yamaguchi | B82Y 10/00 250/307 |

FOREIGN PATENT DOCUMENTS

| JP | 9-330867 | 12/1997 |
| JP | 2002-222633 | 8/2002 |

(Continued)

OTHER PUBLICATIONS

Office Action dated Dec. 30, 2019 in Korean Patent Application No. 10-2018-0085358, 10 pages (with English machine translation).

(Continued)

*Primary Examiner* — James Choi
(74) *Attorney, Agent, or Firm* — Oblon, McClelland, Maier & Neustadt, L.L.P.

(57) ABSTRACT

In one embodiment, a multi charged particle beam writing apparatus includes a plurality of reflective marks disposed on a stage, an inspection aperture member configured to allow one beam to pass therethrough, a first detector detecting a beam current of a beam passed through the inspection aperture member, a second detector detecting charged particles reflected from the reflective marks, a first beam shape calculator generating a beam image based on the beam currents detected by the first detector and calculating a reference beam shape, and a second beam shape calculator calculating a beam shape based on changes in intensity of the reflected charged particles and a position of the stage. The reference beam shape is calculated before writing. During writing, the beam shape based on reflected charged particles is calculated, and variation of the beam shape is added to the reference beam shape.

4 Claims, 8 Drawing Sheets

(51) Int. Cl.
    *H01J 37/304*     (2006.01)
    *H01J 37/04*     (2006.01)

(52) U.S. Cl.
    CPC ........ *H01J 37/304* (2013.01); *H01J 37/3175* (2013.01); *H01J 2237/043* (2013.01); *H01J 2237/24542* (2013.01); *H01J 2237/3045* (2013.01); *H01J 2237/30455* (2013.01)

(56) References Cited

FOREIGN PATENT DOCUMENTS

| | | |
|---|---|---|
| JP | 2003-115430 | 4/2003 |
| JP | 2003-323858 | 11/2003 |
| JP | 2005-347054 | 12/2005 |
| JP | 2007-81263 | 3/2007 |
| JP | 2012-231094 | 11/2012 |
| JP | 2013-118060 | 6/2013 |
| JP | 2016-63149 | 4/2016 |
| KR | 10-0225335 B1 | 10/1999 |

OTHER PUBLICATIONS

Office Action dated Jun. 26, 2020 in Japanese Patent Application No. 2017-146751 (with Computer Generated English Translation).

\* cited by examiner

FIG. 8A
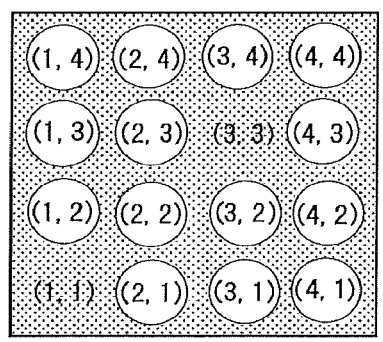
FIG. 8B
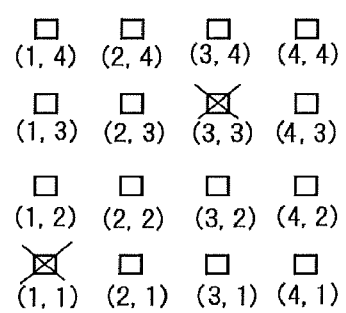
FIG. 8C
| (1, 1) | 0 |
| (1, 2) | 1 |
| (1, 3) | 1 |
| (1, 4) | 1 |
| (2, 1) | 1 |
| (2, 2) | 1 |
| (2, 3) | 1 |
| (2, 4) | 1 |
| (3, 1) | 1 |
| (3, 2) | 1 |
| (3, 3) | 0 |
| (3, 4) | 1 |
| (4, 1) | 1 |
| (4, 2) | 1 |
| (4, 3) | 1 |
| (4, 4) | 1 |

REFERENCE BEAM SHAPE A0

BEAM SHAPE Bn

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2017-146751, filed on Jul. 28, 2017, the entire contents of which are incorporated herein by reference.

FIELD

The present invention relates to a multi charged particle beam writing apparatus and a multi charged particle beam writing method.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using multiple beams can provide significantly improved throughput, because it is capable of irradiating with more beams at a time than when writing with a single electron beam. In a multi-beam writing apparatus, for example, an electron beam emitted from an electron gun is passed through an aperture member having a plurality of holes to form multiple beams, each of which are blanking-controlled. Then, beams that have not been blocked are reduced in size by an optical system and projected onto a substrate placed on a movable stage.

The multi-beam writing apparatus includes a main deflector and a sub-deflector that deflect beams to determine the beam irradiation positions on the substrate. The main deflector determines the positions of the multiple beams at a predetermined location on the substrate, and the sub-deflector deflects the multiple beams to fill in beam pitches.

In this multi-beam writing apparatus, which is capable of irradiating with a plurality of beams at a time, beams formed by passing through the same or different holes in the aperture member are combined (or stitched) together to write a desired pattern of graphic shapes. The shape of the entire image of multiple beams projected onto the substrate (which may hereinafter be referred to as "beam shape") represents the stitching accuracy of written graphics. Therefore, it is important to adjust or compensate for the reduction ratio (or the ratio of expansion and contraction) and distortion of the entire image of multiple beams.

To compensate for distortion of the entire image of multiple beams, it is necessary to accurately measure the beam shape. Conventionally, the beam shape has been measured by sequentially turning on beams to scan therewith a reflective mark on the stage, detecting reflected electrons, and calculating the positions of the beams.

However, in scanning of the reflective mark on the stage, the amount of beam deflection made by the deflector increases and the resulting changes in beam path cause distortion of the beam shape. This leads to reduced accuracy in the measurement of beam positions.

BRIEF DESCRIPTION OF THE DRAWINGS

FIG. 8A illustrates an image obtained by beam scanning, FIG. 8B illustrates beam losses, and FIG. 8C illustrates a defect list.

DETAILED DESCRIPTION

In one embodiment, a multi charged particle beam writing apparatus includes a shaping aperture array including a plurality of holes and configured to form multiple beams by allowing a charged particle beam to pass through the plurality of holes, a blanking aperture array including a plurality of blankers each configured to turn on and off a corresponding beam of the multiple beams, a movable stage configured to hold a substrate thereon, the substrate being a writing target, a stage position detector detecting a position of the stage, a plurality of reflective marks disposed on the stage, an inspection aperture member disposed in the stage and configured to allow one beam of the multiple beams to pass therethrough, a deflector deflecting the multiple beams, a first detector detecting a beam current of each beam of the multiple beams passed through the inspection aperture member by allowing the multiple beams to scan the inspection aperture member, a second detector detecting charged particles reflected from the reflective marks, a first beam shape calculator generating a beam image based on the beam currents detected by the first detector and calculating a reference beam shape based on the beam image and the position of the stage, and a second beam shape calculator switching "on" beams from one to another using the blankers, allowing the "on" beams to scan the reflective marks, and calculating a beam shape based on changes in intensity of the charged particles detected by the second detector and the position of the stage. Based on the reference beam shape and the beam shape calculated by the second beam shape calculator, an amount of irradiation with each beam is adjusted and a beam shape of the multiple beams with which the substrate is irradiated is corrected.

Hereinafter, an embodiment of the present invention will be described based on the drawings. In the embodiment, as an example of a charged particle beam, a configuration using an electron beam will be described. However, the charged particle beam is not limited to an electron beam, and may be an ion beam or the like.

Figure 1:
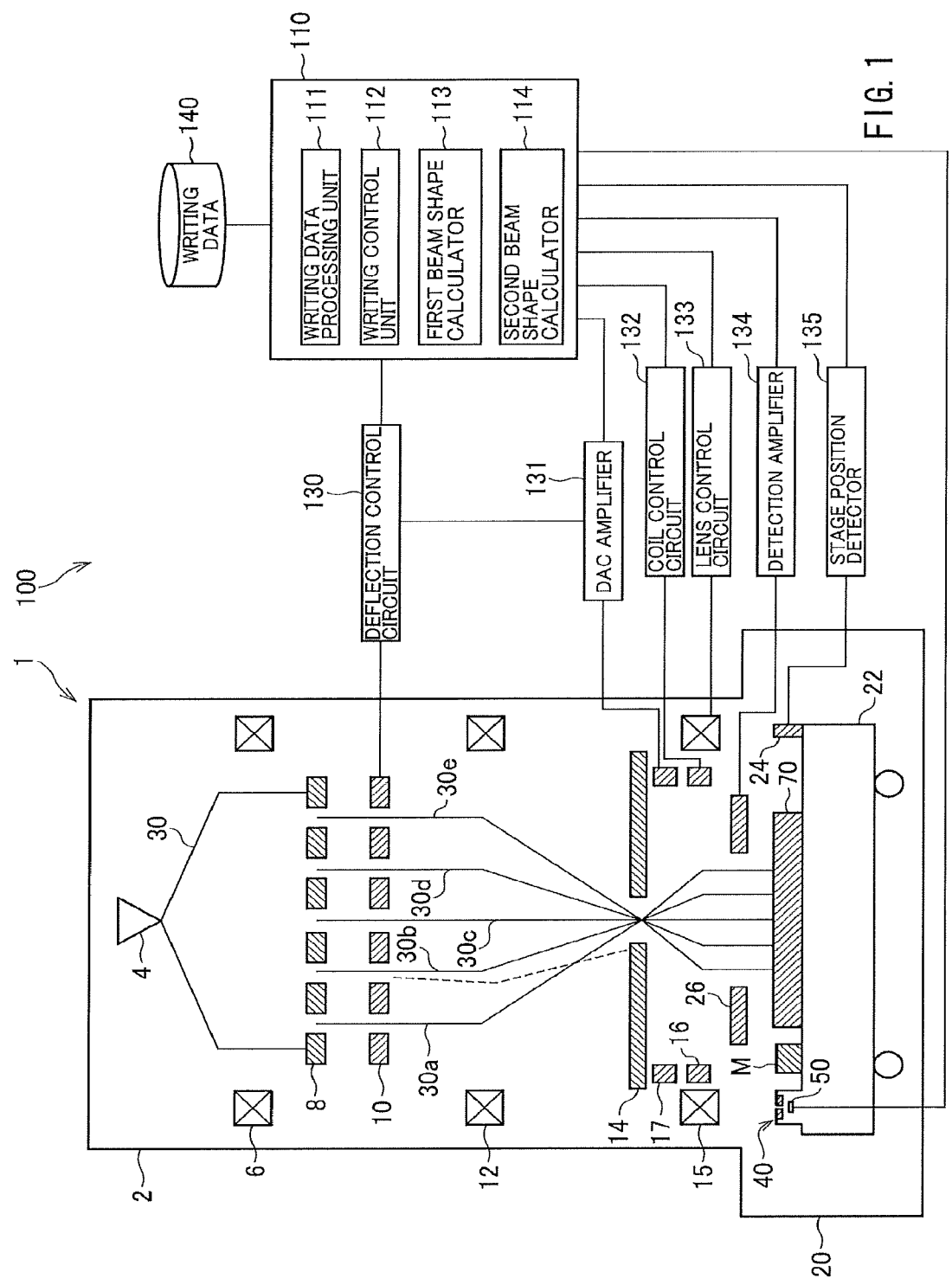
FIG. 1 is a schematic diagram of a multi charged particle beam writing apparatus according to an embodiment of the present invention.

FIG. 1 is a conceptual diagram illustrating a configuration of a writing apparatus according to the present embodiment. In FIG. 1, the writing apparatus includes a writer 1 and a controller 100. This writing apparatus is an exemplary multi charged particle beam writing apparatus. The writer 1 includes a column 2 and a writing chamber 20. The column 2 includes therein an electron gun 4, an illuminating lens 6, a shaping aperture array 8, a blanking aperture array 10, a reducing lens 12, a limiting aperture member 14, an objective lens 15, a coil 16, a main deflector 17 (deflector), and a sub-deflector (not shown).

The writing chamber 20 includes therein an XY stage 22 and a detector 26. A substrate 70, which is a writing target, is placed on the XY stage 22. Examples of the substrate 70 includes an exposure mask used in manufacturing semiconductor devices, and a semiconductor substrate (silicon wafer) on which semiconductor devices are formed. The substrate 70 may be a mask blank on which a resist is applied and nothing has yet been written.

A mirror 24 for measuring the position of the XY stage 22 is disposed on the XY stage 22. A reflective mark M for beam calibration is also on the XY stage 22. To facilitate position detection made by electron beam scanning, the reflective mark M has, for example, the shape of a cross (see FIG. 4). When the cross-shaped reflective mark M is scanned with an electron beam, a detector 26 detects reflected electrons from the reflective mark M.

The XY stage 22 has a multi-beam inspection device at a position different from the position where the substrate 70 is placed. The multi-beam inspection device includes a multi-beam inspection aperture member 40 (hereinafter referred to as "inspection aperture member 40") and a current detector 50. The inspection aperture member 40 is height-adjustable by an adjusting mechanism (not shown). The inspection aperture member 40 is preferably positioned at the same height level as the substrate 70.

Although the XY stage 22 has one multi-beam inspection device in this example, it may have two or more multi-beam inspection devices if there is enough space for arrangement and wiring. More than one reflective mark M (greater in number than the multi-beam inspection device) is provided.

The controller 100 includes a control computer 110, a deflection control circuit 130, a digital-to-analog converter (DAC) amplifier 131, a coil control circuit 132, a lens control circuit 133, a detection amplifier 134, a stage position detector 135, and a storage device 134, such as a magnetic disk device.

The deflection control circuit 130, the coil control circuit 132, the lens control circuit 133, the detection amplifier 134, the stage position detector 135, and the storage device 140 are connected via a bus to the control computer 110. Writing data is externally entered into and stored in the storage device 140.

The DAC amplifier 131 is connected to the deflection control circuit 130. The DAC amplifier 131 is connected to the main deflector 17. The coil 16 is connected to the coil control circuit 132. The objective lens 15 is connected to the lens control circuit 133.

The control computer 110 includes a writing data processing unit 111, a writing control unit 112, a first beam shape calculator 113, and a second beam shape calculator 114. The functions of these units of the control computer 110 may be implemented either by hardware or software. When the functions of the units described above are configured by software, a program that implements at least some of the functions of the control computer 110 may be stored in a recording medium and read and executed by a computer including an electric circuit. The recording medium does not necessarily need to be a removable medium, such as a magnetic disk or an optical disk, and may be a fixed-type recording medium, such as a hard disk device or a memory.

Figure 2:
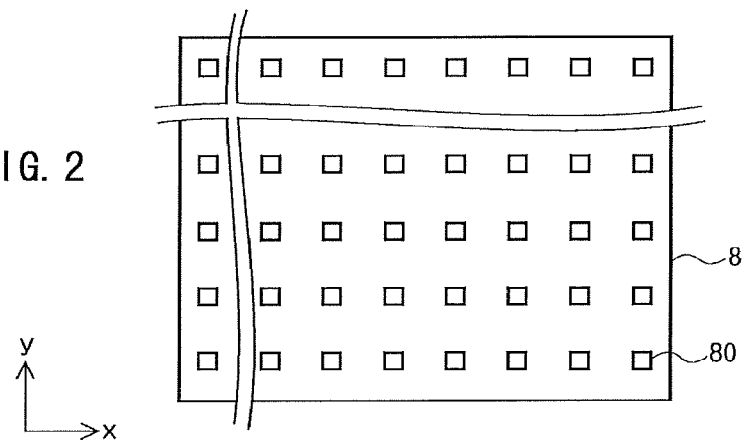
FIG. 2 is a schematic diagram of a shaping aperture array.

FIG. 2 is a conceptual diagram illustrating a configuration of the shaping aperture array 8. As illustrated in FIG. 2, the shaping aperture array 8 has holes (openings) 80 arranged in a matrix of m columns (in the y direction) and n rows (in the x direction) at a predetermined array pitch, where both m and n are greater than or equal to 2 (m, n≥2). The holes 80 are rectangular holes of the same shape and dimensions. The holes 80 may be circular holes of the same diameter.

An electron beam 30 emitted from the electron gun 4 substantially perpendicularly illuminates the entire shaping aperture array 8 through the illuminating lens 6. The electron beam 30 illuminates a region including all the holes 80 in the shaping aperture array 8. Part of the electron beam 30 passes through the plurality of holes 80 to form multiple beams $30a$ to $30e$, such as those illustrated in FIG. 1.

The blanking aperture array 10 has pass holes (openings) arranged to correspond to the respective holes 80 in the shaping aperture array 8 illustrated in FIG. 2. The pass holes are each configured to allow a corresponding beam of the multiple beams to pass therethrough. In the vicinity of each pass hole, blanking deflection electrodes (blanker or blanking deflector) for beam deflection are provided.

The electron beams $30a$ to $30e$ passing through the pass holes are each independently deflected by a voltage applied thereto by the corresponding blanker. Blanking control is done by this deflection. Thus, a plurality of blankers each perform blanking deflection of a corresponding beam of the multiple beams exiting the holes 80 (openings) in the aperture member 8.

The multiple beams $30a$ to $30e$ passed through the blanking aperture array 10 are reduced in beam size and array pitch by the reducing lens 12, and travel toward a center hole formed in the limiting aperture member 14. Electron beams that have been deflected by the blankers of the blanking aperture array 10 change their paths, deviate from the center hole in the limiting aperture member 14, and are blocked by the limiting aperture member 14. On the other hand, electron beams that have not been deflected by the blankers of the blanking aperture array 10 pass through the center hole in the limiting aperture member 14.

The limiting aperture member 14 blocks electron beams that have been deflected by the blankers of the blanking aperture array 10 in such a manner as to be turned off. Beams passed through the limiting aperture member 14 after being turned on and before being turned off are defined as one electron beam shot.

The electron beams $30a$ to $30e$ passed through the limiting aperture member 14 are aligned by the coil 16, brought into focus by the objective lens 15, and formed into a pattern image with a desired reduction ratio on the substrate 70. The electron beams (multiple beams) passed through the limiting aperture member 14 are deflected together in the same direction by the main deflector 17 and projected onto the substrate 70 at writing positions (irradiation positions).

During continuous movement of the XY stage 22, the beam writing positions (irradiation positions) are tracking-controlled by the main deflector 17 in such a manner as to follow the movement of the XY stage 22. The position of the XY stage 22 is measured using reflection of laser light emitted from the stage position detector 135 toward the mirror 24 on the XY stage 22.

Multiple beams applied at a time are ideally arranged at a pitch that is obtained by multiplying the array pitch of the holes 80 in the shaping aperture array 8 by the desired reduction ratio described above. When this writing apparatus performs a writing operation to write a desired pattern using a raster scanning technique, which involves sequential and continuous shot beam irradiation, beams that are required to produce the pattern are controlled to be turned on by blanking control.

The writing data processing unit 111 of the control computer 110 reads writing data from the storage device 140 and performs multiple stages of data conversion to generate shot data. The shot data defines whether to irradiate, for example, each of a plurality of beam-sized irradiation regions into which a writing surface of the substrate 70 is divided in the form of a lattice, and also defines the irradiation time.

On the basis of the shot data and the stage position information, the writing control unit 112 outputs a control signal to the deflection control circuit 130. On the basis of the control signal, the deflection control circuit 130 controls the voltage applied by each blanker of the blanking aperture array 10. Also, the deflection control circuit 130 computes data representing the amount of deflection (tracking deflection data) for deflecting beams in such a manner that the beams follow the movement of the XY stage 22. The tracking deflection data, which is a digital signal, is output to the DAC amplifier 131, by which the digital signal is converted to an analog signal, amplified, and applied as a tracking deflection voltage to the main deflector 17.

In this multi-beam writing apparatus, many beams arranged at a pitch obtained by multiplying the array pitch of the holes 80 in the shaping aperture array 8 by a predetermined reduction ratio are applied to the substrate 70 (writing target) at a time and combined together to fill in the beam pitches, and thus a desired pattern of graphic shapes is written. This requires, before and/or during writing, detection of beam positions, calculaton of the beam shape, and adjustment of dimensions.

The writing apparatus of the present embodiment uses two types of calculation including a method that uses the multi-beam inspection device to calculate the beam shape with high accuracy, and a method that uses the reflective mark M to calculate the beam shape in a simple way.

Figure 3:
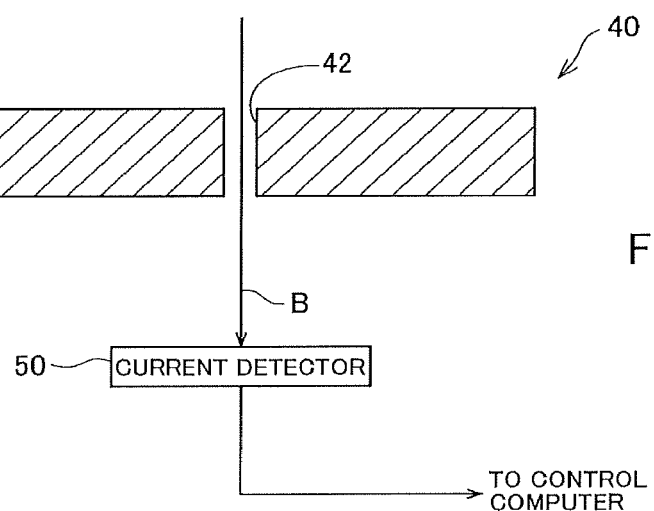
FIG. 3 is a cross-sectional view of a multi-beam inspection aperture member according to the embodiment.

FIG. 3 is a schematic diagram illustrating a configuration of the multi-beam inspection device. The inspection aperture member 40 is configured to allow only one electron beam to pass therethrough. The inspection aperture member 40 has, for example, a circular planar shape and is provided with a through hole 42 through which one beam passes along the central axis.

After passing through the through hole 42, an electron beam B enters the current detector 50, by which a beam current is detected. For example, a solid-state detector (SSD) may be used as the current detector 50. A result of the detection made by the current detector 50 is sent to the control computer 110.

The first beam shape calculator 113 calculates the beam shape by using the detected beam currents obtained by scanning the inspection aperture member 40 with multiple beams.

Figure 4:
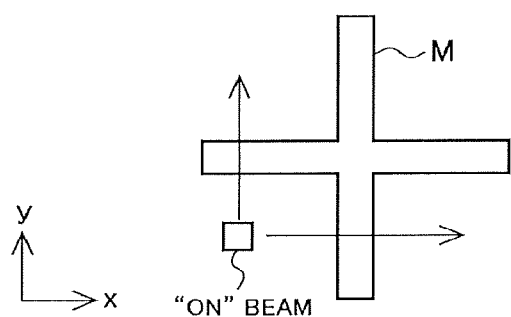
FIG. 4 is a plan view of a reflective mark.

The reflective marks M are each, for example, in the shape of a cross, such as that illustrated in FIG. 4. The electron beam B is deflected back and forth and from side to side (i.e., in the x direction and the y direction) by the main deflector 17 to scan the cross-shaped reflective mark M. The reflected electrons are detected by the detector 26, amplified by the detection amplifier 134, converted to digital data, and output as measurement data to the control computer 110. The second beam shape calculator 114 calculates the beam position on the basis of a profile in which measured reflected electrons are chronologically arranged (i.e., changes in the intensity of reflected electrons) and the corresponding stage position.

Figure 5:
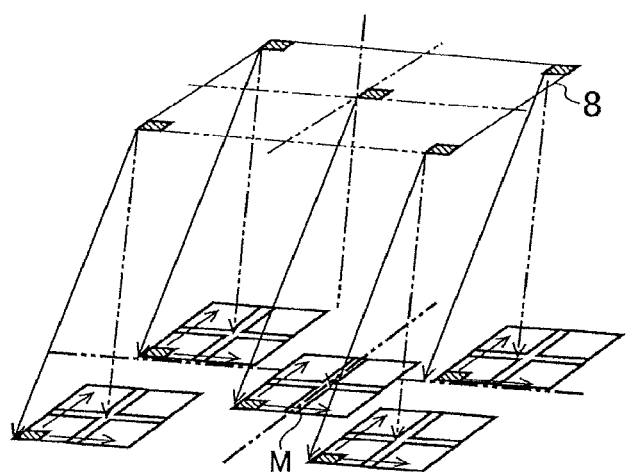
FIG. 5 illustrates how a beam shape is calculated.

In the calculation of the beam shape, only specific beams are turned on and the reflective marks M are moved to directly below the "on" beams on the basis of a designed beam size. Then, the cross-shaped reflective marks M are scanned to calculate the beam positions. For example, as illustrated in FIG. 5, a beam corresponding to the center of the shaping aperture array 8 and beams corresponding to the four corners of the shaping aperture array 8 are sequentially turned on so as to calculate the positions of the respective beams and determine the beam shape.

When measured using the inspection aperture member 40, the beam shape is determined from the detected beam currents and thus is calculated with high accuracy. However, as described above, the through hole 42 in the inspection aperture member 40 allows only one beam to pass therethrough and its diameter is limited. This means that if the through hole 42 is frequently used (i.e., beam scanning takes place many times), the through hole 42 may be clogged with contamination. In view of the clogging of the through hole 42, a plurality of inspection aperture members 40 may be installed in the XY stage 22. However, this requires as many current detectors 50 as there are inspection aperture members 40. That is, as the number of inspection aperture members 40 increases, the wiring becomes complex and it becomes difficult to secure space for the installation.

A plurality of (many) reflective marks M can be used because they can be easily placed on the XY stage 22. Therefore, if one reflective mark M deteriorates by beam scanning, other reflective marks M can be sequentially used. However, the calculation of the beam shape using the reflective marks M involves considerable deflection by the main deflector 17. Depending on the position of deflection made by the main deflector 17, the beam position deviates and the beam shape is distorted. Therefore, the calculation of the beam shape using the reflective marks M is less accurate than that using the inspection aperture member 40.

In view of the features described above, in the present embodiment, the inspection aperture member 40 is used to calculate the beam shape before writing, the dose is modulated with respect to the result of this calculation, and the beam shape is corrected. During writing, the reflective marks M are used to calculate the beam shape, for example, at regular intervals. Then, if a comparison between the beam shape calculated using the reflective marks M before writing and the beam shape calculated using the reflective marks M during writing shows that there is a difference in beam shape therebetween, the difference is added to the reference beam shape to update the beam shape. The frequency of use of the inspection aperture member 40 can thus be reduced. Also, since the measurement using the reflective marks M is made to determine temporal changes in beam shape, it is possible to reduce the impact of beam shape distortion caused by deflection.

Figure 6:
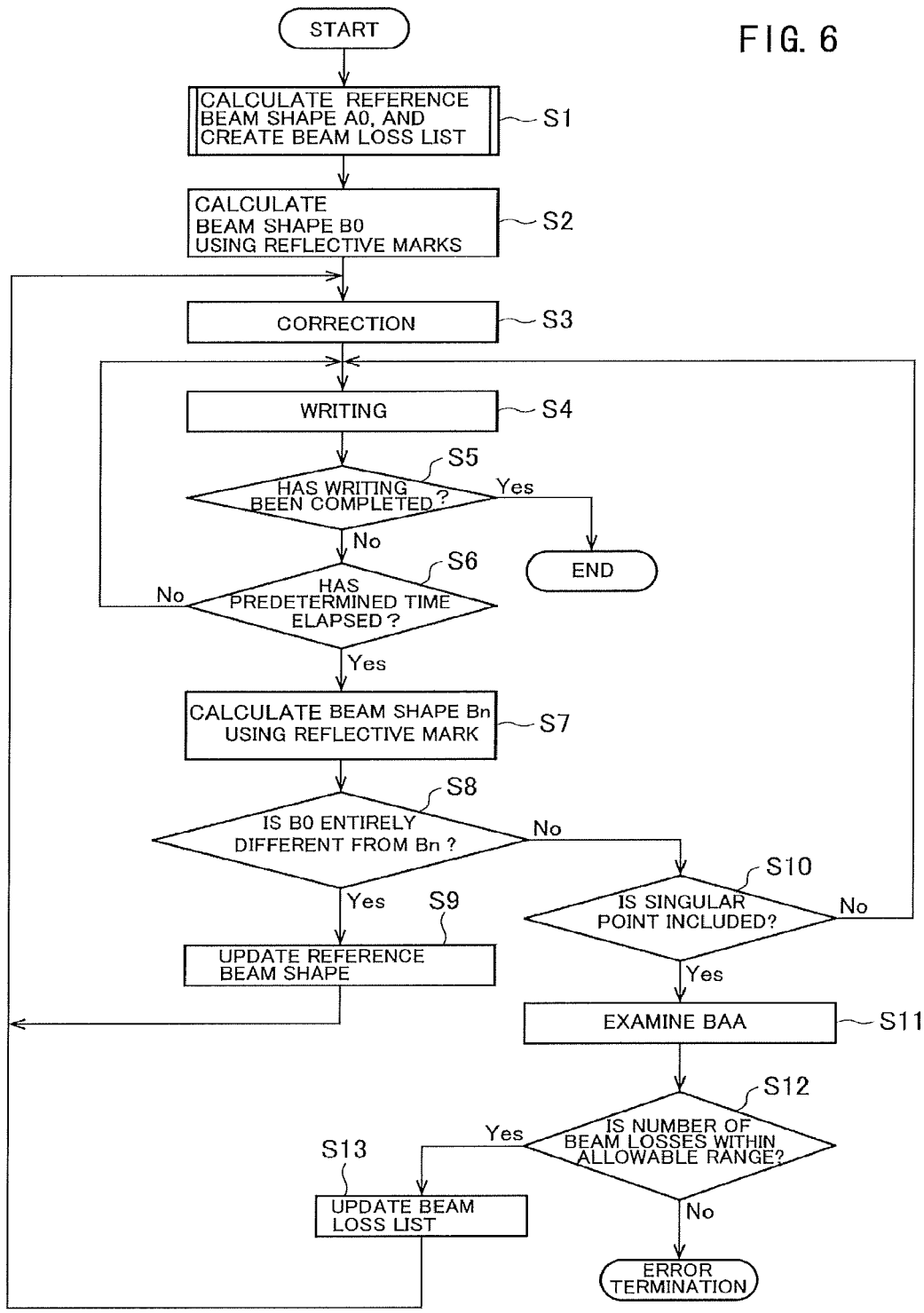
FIG. 6 is a flowchart illustrating a multi charged particle beam writing method according to the embodiment.

A writing method according to the present embodiment is described using the flowchart of FIG. 6.

First, by using the inspection aperture member 40, a reference beam shape A0 is calculated and a beam loss list is created (step S1). This operation is described in detail in accordance with the flowchart of FIG. 7.

The blanking aperture array 10 is divided into a plurality of measurement regions, and the inspection aperture member 40 is scanned with beams corresponding to each of the measurement regions. In other words, the shaping aperture array 8 is divided into a plurality of measurement regions, and beams passed through the holes 80 in the measurement regions are turned on and used to scan the inspection aperture member 40.

The blanking aperture array 10 (shaping aperture array 8) is divided into a plurality of measurement regions, because the maximum amount of deflection made by the main deflector 17 used for beam scanning is not large enough to cover the entire area of the blanking aperture array 10. Even if the amount of deflection is large enough to cover the entire area of the blanking aperture array 10, an increase in the amount of beam deflection results in changes in beam path, causes distortion of the beam shape, and leads to reduced accuracy in the measurement of beam positions. It is thus preferable that the amount of deflection used for the measurement be small enough not to cause distortion of the beam shape. Therefore, the number of regions "n" into which the blanking aperture array 10 is divided is determined first (where n is an integer greater than or equal to two) (step S21).

If the amount of deflection made by the main deflector 17 is large enough to cover the entire area of the blanking aperture array 10 and distortion of the beam shape caused by beam deflection is small enough not to affect calculation accuracy, there is no need to carry out division into measurement regions.

A region where no measurement has been made is selected and determined as a measurement region (step S22). The XY stage 22 is moved and the inspection aperture member 40 is positioned directly below the beams corresponding to the measurement region (step S23).

For example, a voltage applied by the blankers in the measurement region is set to 0 V, whereas a voltage applied by the blankers in the other regions (non-measurement regions) is set to 5 V. A plurality of beams turned on by the blankers in the measurement region are deflected by the main deflector 17 in the XY direction and used to scan the inspection aperture member 40, so that the electron beams are sequentially allowed to pass through the through hole 42 (step S24). The current detector 50 detects each beam current.

The control computer 110 converts the beam currents detected by the current detector 50 into luminance, generates a beam image on the basis of the amount of deflection made by the main deflector 17, and performs image analysis (step S25). For example, a beam image such as that illustrated in FIG. 8A is generated. This is an image of an exemplary inspection region, which is a four by four array with (1, 1) at the lower left corner.

This image shows, as in FIG. 8B, that there are beam losses at (1, 1) and (3, 3). Then, a defect list presenting blanker "always-off" defects, such as that shown in FIG. 8C, is created.

Figure 9:
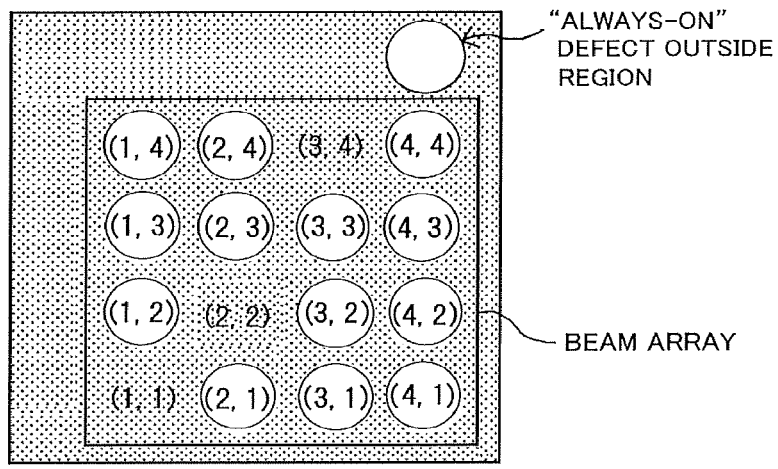
FIG. 9 illustrates an example of beam array recognition processing.

If there is a beam with an "always-on" defect in the vicinity of the measurement region, an image such as that illustrated in FIG. 9 is obtained. The first beam shape calculator 113 recognizes a beam array region corresponding to the measurement region, and a defect outside the region is ignored. For example, since the measurement region is determined to be a four by four array in advance, the first beam shape calculator 113 recognizes the beam array in such a manner that the number of beams included in the region of the four by four array size is maximized.

The first beam shape calculator 113 detects the position of each beam in the beam array region by using the stage position detected by the stage position detector 135. From the position of each beam, the first beam shape calculator 113 calculates the central coordinates of the beam array corresponding to the measurement region (step S26).

Figure 10:
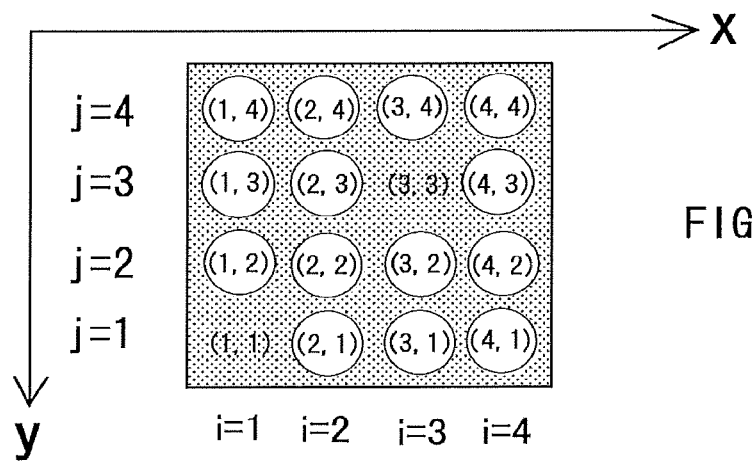
FIG. 10 illustrates how center coordinates of a beam array are determined.

For example, variables i and j are set as illustrated in FIG. 10, and the x and y coordinates of each beam are fitted to the following equations to determine coefficients $a_0$, $a_1$, $a_2$, $b_0$, $b_1$, and $b_2$. Since there are beam losses at (1, 1) and (3, 3) in the example illustrated in FIG. 10, the x and y coordinates of the other beams are fitted to the following equations:

$$x_i = a_0 + a_1 i + a_2 j$$

$$y_i = b_0 + b_1 i + b_2 j$$

After the coefficients $a_0$, $a_1$, $a_2$, $b_0$, $b_1$, and $b_2$ are determined, the central coordinates are calculated using these equations. In the example illustrated in FIG. 10, substituting i=2.5 and j=2.5 into the equations yields the central coordinates of the beam array. The equations described above may take into account not only the first order terms, but also the second and higher order terms.

The scanning of the inspection aperture member 40, image analysis, and calculation of the central coordinates of the beam array described above are performed for each of the "n" measurement regions of the blanking aperture array 10 (steps S22 to S27).

Figure 11:
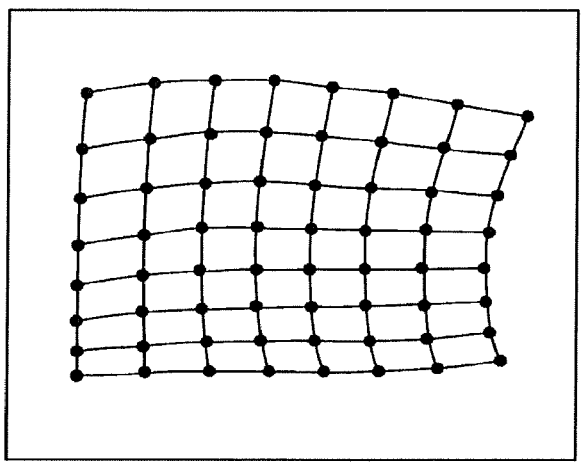
FIG. 11 illustrates a calculated beam shape.

After completion of measurement for all the measurement regions (Yes in step S27), the first beam shape calculator 113 calculates the beam shape on the basis of the central coordinates of the beam arrays corresponding to the respective measurement regions (step S28). For example, the first beam shape calculator 113 fits the central coordinates of the beam arrays corresponding to the "n" measurement regions to a third-order polynomial to determine a polynomial representing the beam shape. Plotting this polynomial on a graph produces a beam shape, such as that shown in FIG. 11. FIG. 11 shows a beam shape produced in a visually easy-to-understand manner by plotting deviations from an ideal lattice that is set in a range of $-1 \leq x \leq 1$ and $-1 \leq y \leq 1$. The beam shape calculated in the above-described manner is the reference beam shape A0.

The first beam shape calculator 113 creates a beam defect list by using the defect lists for the respective measurement regions (step S29).

After the reference beam shape A0 is calculated and the beam defect list is created (step S1 in FIG. 6), a beam shape B0 is calculated using the reflective marks M (step S2). As described above, the beam shape B0 is calculated by sequentially turning on beams, moving the reflective marks M to directly below the "on" beams, scanning the reflective marks M, and calculating the beam positions.

The writing data processing unit 111 modulates the dose in such a manner as to correct the beam shape on the basis of the reference beam shape A0, and generates shot data by taking into account unusable beams on the basis of the defect list (step S3). The writing control unit 112 controls the writer 1 using the shot data to perform writing (step S4).

Every time a predetermined time elapses until completion of writing (No in step S5, Yes in step S6), a beam shape Bn is calculated using the reflective marks M (step S7).

The control computer 110 compares the beam shape B0 calculated using the reflective marks M before writing and the beam shape Bn calculated in step S7. Then if there is an overall change in beam shape (Yes in step S8), the difference in beam shape (Bn−B0) is added to the reference beam shape A0 to update the reference beam shape (step S9). A reference beam shape An obtained after the update is represented by An=A0+(Bn−B0). After the update, the dose is modulated on the basis of the reference beam shape An.

Since the beam shapes B0 and Bn include measurement errors resulting from error that is undetectable with the reflective marks M, it is not desirable to treat the beam shapes B0 and Bn as absolute values. In contrast, the difference between the beam shapes B0 and Bn includes no measurement errors resulting from such error, and can be considered as a change associated with temporal changes in the electron gun 4 (electron source) and the like. Therefore, the reference beam shape can be updated by adding the difference (Bn−B0) thereto.

Figure 12:
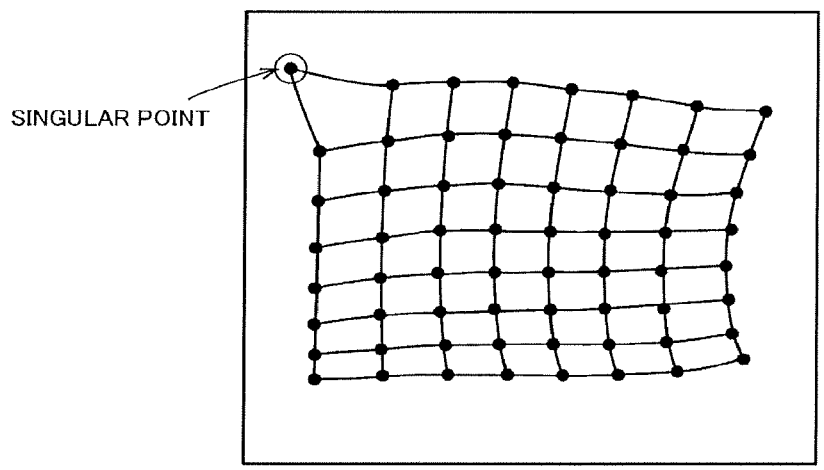
FIG. 12 illustrates a beam shape including a singular point.

If there is no overall change between the beam shape B0 and the beam shape Bn (No in FIG. 8), a determination is made as to whether the beam shape Bn includes a singular point, such as that illustrated in FIG. 12 (step S10). For example, the position (calculated position) of each beam in the beam shape Bn is compared with a position (ideal position) defined by an equation that approximates beam positions, and if there is a beam that deviates by a predetermined value or more, a singular point is determined to exist.

Figure 7:
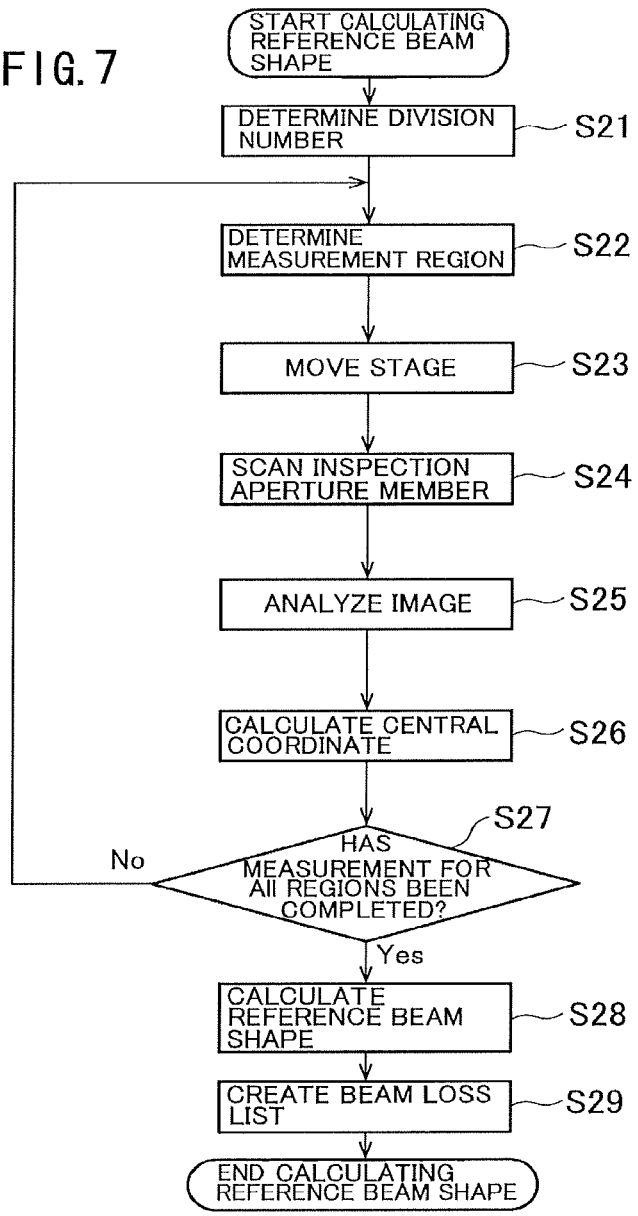
FIG. 7 is a flowchart illustrating a detailed beam shape calculating method using the inspection aperture member.

This singular point is thought to be generated by the occurrence of a new defect in a blanker of the blanking aperture array 10 (BAA 10). Therefore, if the beam shape Bn includes a singular point (Yes in step S10), the blanking aperture array 10 is examined (step S11). For example, the processing in the flowchart of FIG. 7 is performed to detect beam losses.

If the number of beam losses is within the allowable range (i.e., less than or equal to a predetermined value) (Yes in step S12), then the defect list is updated (step S13). Writing is performed on the basis of the updated defect list. If the number of beam losses exceeds the predetermined value (No in step S12), the process is terminated by error.

As described above, in the present embodiment, the reference beam shape A0 is accurately calculated using the inspection aperture member 40 before writing, the dose is modulated on the basis of the reference beam shape A0, and the beam shape is accurately corrected to perform writing.

A comparison is made between the beam shape B0 calculated using the reflective marks M before writing and the beam shape Bn calculated using the reflective marks M during writing. The reference beam shape is then updated by adding thereto the amount of change in beam shape (Bn−B0) resulting from temporal changes in the electron source and the like. Since the beam shapes calculated using the reflective marks M are not treated as absolute values, the impact of beam shape distortion can be reduced.

Measurement using the reflective marks M is performed at regular intervals during writing. Many reflective marks M can be provided on the XY stage 22. Therefore, even if one reflective mark M deteriorates, unused reflective marks M can be used. Also, using the reflective marks M makes it possible to reduce the frequency of use of the inspection aperture member 40 and prevent deterioration of the inspection aperture member 40 (e.g., clogging of the through hole 42).

In the embodiment described above, the amount of beam drift (i.e., the amount of shift of entire beams) may be measured on the basis of changes in the intensity of reflected electrons and the stage position, by stopping the writing operation at intervals of predetermined writing units, moving the reflective marks M to directly below the column 2, and scanning the reflective marks M while switching the "on" beams from one to another.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   a shaping aperture array including a plurality of holes and the shaping aperture array configured to form multiple beams by allowing a charged particle beam to pass through the plurality of holes;
   a blanking aperture array including a plurality of blankers, each of the blankers configured to turn on and off a corresponding beam of the multiple beams;
   a movable stage configured to hold a substrate thereon, the substrate being a writing target;
   a stage position detector detecting a position of the movable stage;
   a plurality of reflective marks disposed on the movable stage;
   an inspection aperture member disposed in the movable stage and configured to allow one beam of the multiple beams to pass therethrough;
   a deflector deflecting the multiple beams;
   a first detector detecting a beam current of each beam of the multiple beams passed through the inspection aperture member by allowing the multiple beams to scan the inspection aperture member;
   a second detector detecting charged particles reflected from the reflective marks;
   a first beam shape calculator generating a beam image based on beam currents of the multiple beams detected by the first detector and calculating a first beam shape based on the beam image and the position of the movable stage; and
   a second beam shape calculator switching "on" beams from one to another using the blankers, allowing the "on" beams to scan the reflective marks, and calculating a second beam shape based on changes in intensity of the charged particles detected by the second detector and the position of the movable stage,
   wherein based on the first beam shape and the second beam shape, an amount of irradiation with each beam is adjusted and a beam shape of the multiple beams with which the substrate is irradiated is corrected,
   before writing, the first beam shape calculator calculates the first beam shape and the second beam shape calculator calculates the second beam shape,
   during writing, the second beam shape calculator calculates the second beam shape at predetermined time intervals and updates the first beam shape by adding a difference between the second beam shape calculated before writing and the second beam shape calculated during writing to the first beam shape, and
   after updating the first beam shape, based on the updated first beam shape, the amount of irradiation with each beam is adjusted and a beam shape of the multiple beams with which the substrate is irradiated is corrected.

2. The multi charged particle beam writing apparatus according to claim 1, wherein if the second beam shape calculated by the second beam shape calculator during writing includes a singular point, the inspection aperture member is scanned with the multiple beams, and a defect in the blanking aperture array is detected using the beam image generated based on the detected beam currents.

3. A charged particle beam writing method comprising:
emitting a charged particle beam;
forming multiple beams by allowing the charged particle beam to pass through a plurality of openings in an aperture member;
performing blanking deflection involving turning on and off a corresponding beam of the multiple beams using a plurality of blankers;
deflecting the multiple beams, using a deflector, to writing positions of the respective beams in such a manner that the beams follow movement of a stage capable of holding a substrate thereon;
scanning an inspection aperture member with the multiple beams, the inspection aperture member being disposed in the stage and configured to allow one beam of the multiple beams to pass therethrough;
detecting a beam current of each beam of the multiple beams passed through the inspection aperture member;
generating a beam image based on beam currents of the multiple beams and calculating a first beam shape based on the beam image and a position of the stage;
scanning reflective marks on the stage with "on" beams while switching the "on" beams from one to another;
detecting charged particles reflected from the reflective marks;
calculating a second beam shape based on changes in intensity of the reflected charged particles and the position of the stage; and
adjusting an amount of irradiation with each beam based on the first beam shape and correcting a beam shape of the multiple beams with which the substrate is irradiated,
wherein before writing, the first beam shape is calculated, and the second beam shape based on the reflected charged particles is calculated,
during writing, the second beam shape based on the reflected charged particles is calculated at predetermined time intervals, and the first beam shape is updated by adding a difference between the second beam shape calculated before writing and the second beam shape calculated during writing to the first beam shape,
before writing, the second beam shape based on changes in intensity of the reflected charged particles and the position of the stage is measured,
during writing, the second beam shape based on changes in intensity of the reflected charged particles and the position of the stage is measured at the predetermined time intervals, and the first beam shape is updated by adding a difference between the second beam shape calculated before writing and the second beam shape calculated during writing to the first beam shape, and
after updating the first beam shape, based on the updated first beam shape, the amount of irradiation with each beam is adjusted and a beam shape of the multiple beams with which the substrate is irradiated is corrected.

4. The charged particle beam writing method according to claim 2, wherein if the second beam shape calculated during writing includes a singular point, the inspection aperture member is scanned with the multiple beams, and a defect in a blanking aperture array is detected using the beam image generated based on the detected beam currents.

* * * * *